(12) United States Patent
Hamaguchi

(10) Patent No.: US 9,064,843 B2
(45) Date of Patent: Jun. 23, 2015

(54) SEMICONDUCTOR DEVICE AND MANUFACTURING METHOD THEREOF

(71) Applicant: KABUSHIKI KAISHA TOSHIBA, Tokyo (JP)

(72) Inventor: Masafumi Hamaguchi, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/917,989

(22) Filed: Jun. 14, 2013

(65) Prior Publication Data

US 2014/0197485 A1    Jul. 17, 2014

(30) Foreign Application Priority Data

Jan. 11, 2013  (JP) ................................. 2013-003608

(51) Int. Cl.
*H01L 29/40* (2006.01)
*H01L 29/417* (2006.01)
*G06F 17/50* (2006.01)

(52) U.S. Cl.
CPC ........ *H01L 29/41775* (2013.01); *H01L 29/401* (2013.01)

(58) Field of Classification Search
USPC ....................................................... 716/50, 54
See application file for complete search history.

(56) References Cited

U.S. PATENT DOCUMENTS 6,746,915 B2 *  6/2004  Wu ............................... 438/253
2008/0023772 A1   1/2008  Kawakita

FOREIGN PATENT DOCUMENTS

JP      5-335305 A    12/1993
JP      7-131003 A     5/1995

* cited by examiner

*Primary Examiner* — Sun Lin
(74) *Attorney, Agent, or Firm* — Patterson & Sheridan LLP

(57) ABSTRACT

A semiconductor device includes a substrate, and a gate electrode formed on the substrate on a gate insulation film. The semiconductor device also includes a source diffusion layer and a drain diffusion layer which are formed on the substrate where the gate electrode is sandwiched between the source diffusion layer and the drain diffusion layer, one or more source contacts formed on the source diffusion layer; and one or more drain contacts formed on the drain diffusion layer. At least one of the source contacts and the drain contacts includes a first contact region having a first size and a second contact region having a second size larger than the first size on the same source diffusion layer or on the same drain diffusion layer.

12 Claims, 10 Drawing Sheets

US 9,064,843 B2

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2013-003608, filed Jan. 11, 2013, the entire contents of which are incorporated herein by reference.

FIELD

Embodiments described herein relate to a semiconductor device and a manufacturing method thereof.

BACKGROUND

The generation (technical node) of semiconductor devices has currently advanced through the 90 nm generation, the 64 nm generation, the 45 nm generation, the 32 nm generation and the 22 nm generation node. Further, the 28 nm generation (which is the half-node of the 32 nm generation) has been attracting attention as the design architecture and semiconductor manufacturing technique which is equivalent to the 32 nm generation node. However, although a critical layer to which the strictest design criteria is applied can be manufactured by performing a single exposure in the 32 nm generation, at 28 nm and succeeding generations, because of inherent physical limits which occur by single exposure of a feature, critical layers cannot be manufactured unless double exposure is performed, i.e., the feature must be created by twice exposing the resist, and then etching an underlying hard mask and to be etched layer.

For example, at the 28 nm generation and succeeding generations, the double exposure becomes necessary when forming a hole for a contact plug (hereinafter referred to as a "contact"). However, to reduce manufacturing costs of the semiconductor device, an attempt has been made to manufacture a contact in the 28 nm generation and succeeding generations when performing single exposure by changing the number of contacts or a size of a contact at the time of preparing a photo mask. However, when the single exposure is replaced with the double exposure in this manner, there arises a drawback in that irregular layout dependency is observed in an FET manufactured by the single exposure, and such layout dependency differs from the layout dependency of an FET manufactured by double exposure. In this case, the design and an operation verification result of the FET manufactured by double exposure cannot be utilized by the FET manufactured by single exposure and hence, it is necessary to perform operation verification independent, i.e., different from, the operation verification methodology performed on the FET manufactured by single exposure.

Further, there exists a situation where it is desirable that the same design parameters as the 32 nm generation are used at the 28 nm generation node. However, because the above-mentioned drawback exists, an operational characteristic of an FET of the 28 nm generation manufactured by single exposure becomes different from an operational characteristic of an FET of the 32 nm generation manufactured by single exposure (similar to an operational characteristic of an FET of the 28 nm generation manufactured by double exposure) and hence, the 28 nm generation cannot use the same design parameters as the 32 nm generation. As a result, the design and the operation verification methodology of the FET of the 32 nm generation cannot be utilized by an FET of the 28 nm generation and hence, also in the 28 nm generation, it is necessary for the 28 nm generation to perform the operation verification independently.

DETAILED DESCRIPTION

In general, according to one embodiment, the semiconductor device includes a substrate, and a gate electrode formed on the substrate on a gate insulation film. The semiconductor device also includes a source diffusion layer and a drain diffusion layer which are formed within the substrate, wherein the gate electrode is sandwiched between the source diffusion layer and the drain diffusion layer. One or more source contacts are formed on the source diffusion layer, and one or more drain contacts are formed on the drain diffusion layer. At least one of the source contact and the drain contact includes a first contact region having a first size and a second contact region having a second size larger than the first size on the same source diffusion layer or on the same drain diffusion layer.

Hereinafter, embodiments are explained in conjunction with the drawings.

First Embodiment

Figure 1A:
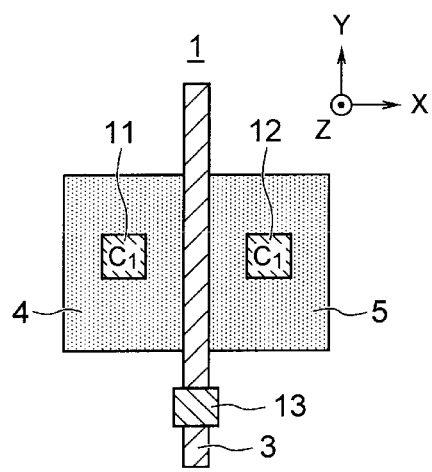
FIG. 1A to FIG. 1F are plan views showing the layout or pattern of structure based upon design data of a semiconductor device according to a first embodiment.
Figure 1B:
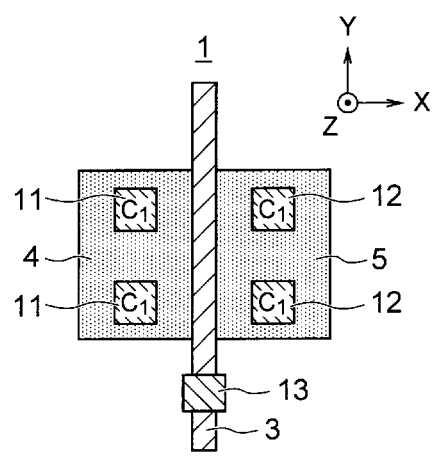
Figure 1C:
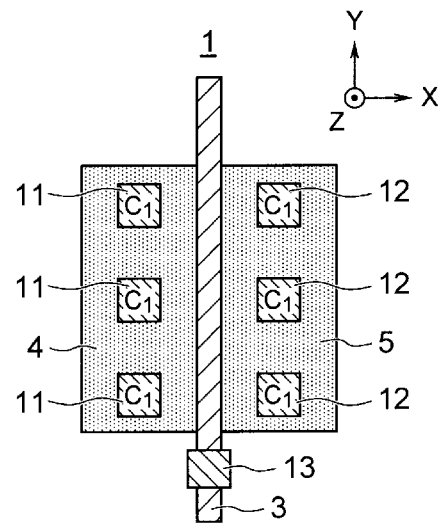
Figure 1D:
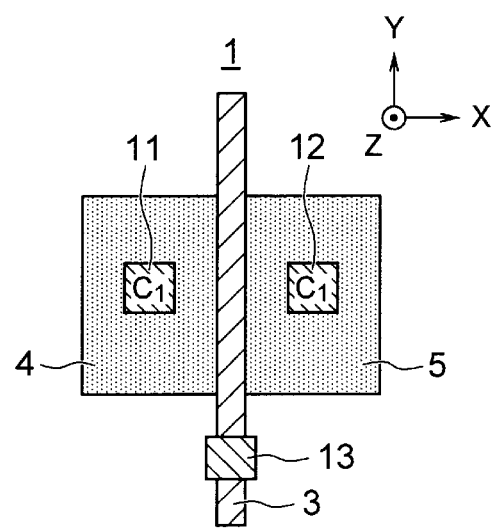
Figure 1E:
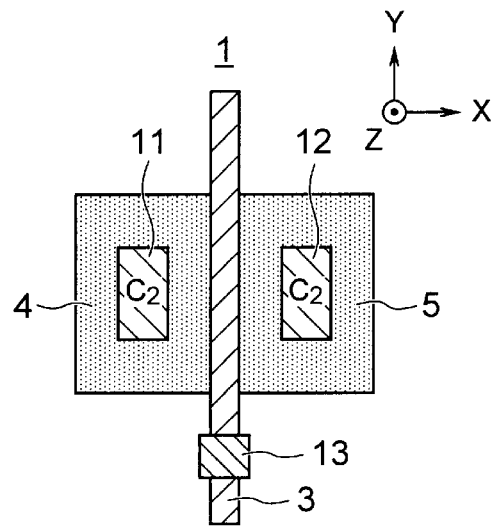
Figure 1F:
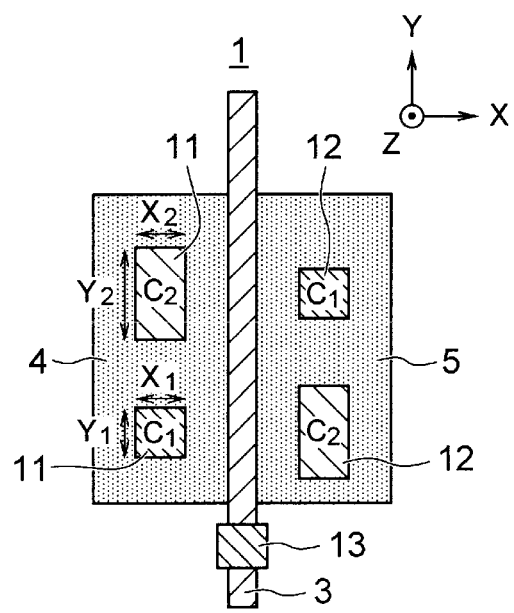

FIG. 1A to FIG. 1F are plan views showing the pattern of structures of a semiconductor device according to the first embodiment. FIG. 1A to FIG. 1C show three examples of the layout or pattern of structures to be formed based upon design data of the semiconductor device according to the first embodiment. On the other hand, FIG. 1D to FIG. 1F show the resulting formed structures of the semiconductor device when actually manufactured based on the design data shown in FIG. 1A to FIG. 1C, respectively.

Figure 2A:
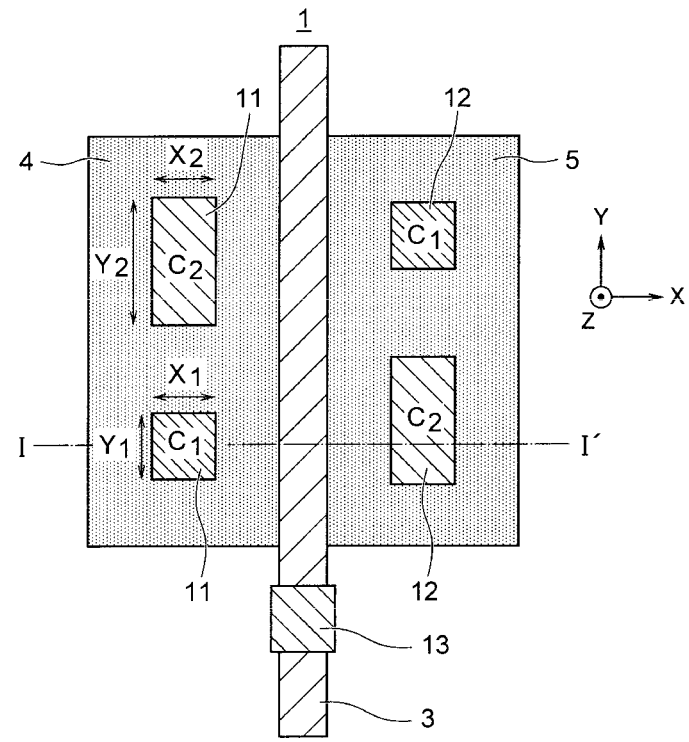
FIG. 2A is a plan view showing the structure of the semiconductor device shown in FIG. 1F.
Figure 2B:
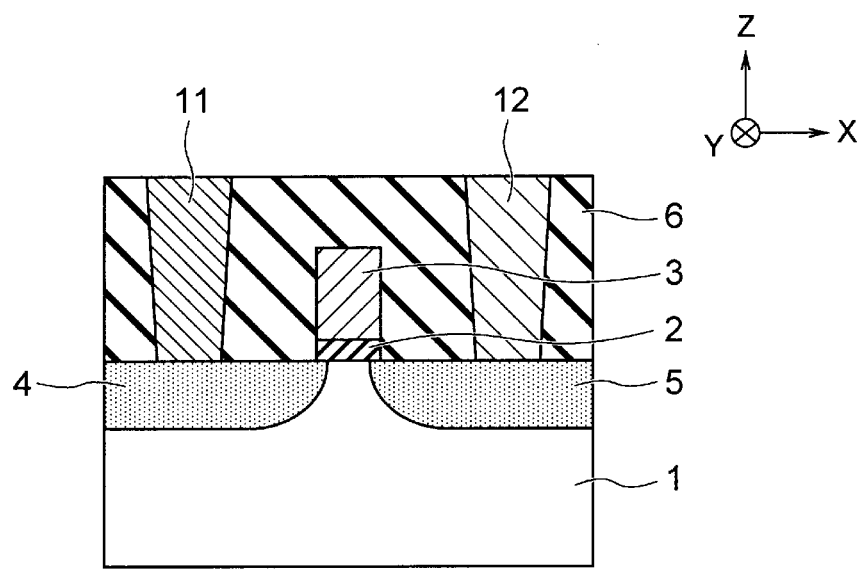
FIG. 2B is a cross-sectional view showing the structure of the semiconductor device shown in FIG. 1F.

FIG. 2A and FIG. 2B are views showing the structure of the semiconductor device shown in FIG. 1F, wherein FIG. 2A is an enlarged plan view showing the structure shown in FIG. 1F, and FIG. 2B is a cross-sectional view of the structure of FIG. 2A taken along a line I-I' in FIG. 2A.

The semiconductor device of this embodiment is explained in detail by reference to FIG. 1 hereinafter, and the explanation is also made by reference to FIG. 2, when necessary.

All drawings from FIG. 1A to FIG. 1F show one FET which is included in a semiconductor device according to this embodiment. The semiconductor device according to this embodiment includes, as constitutional elements of the FET, a substrate 1, a gate insulation film 2 (see FIG. 2), a gate electrode 3, a source diffusion layer 4, a drain diffusion layer 5, an interlayer insulation film 6 (see FIG. 2), one or more source contacts 11, one or more drain contacts 12, and a gate contact 13. Although the semiconductor device according to this embodiment may be a semiconductor device of the generation where double exposure is performed (any one of generations including the 28 nm generation and the generations which follow, i.e., having a device pitch of less than the 28 nm generation, for example), the semiconductor device according to this embodiment is manufactured by performing single exposure using a technique for manufacturing a semiconductor device of this generation. Thus, the semiconductor devices in the 28 nm generation, and succeeding generations, include the semiconductor device of the 28 nm generation and semiconductor devices of the generations which follow the 28 nm generation.

The substrate 1 is a semiconductor substrate such as a silicon substrate, for example. In FIG. 1, the X direction and the Y direction which are parallel to a main surface of the substrate 1 and are orthogonal to each other, and the Z direction which is perpendicular to the main surface of the substrate 1 are shown. The X direction and the Y direction correspond to the longitudinal direction of the gate and the channel width direction of the FET. Here, the substrate 1 may be an SOI (Semiconductor On Insulator) substrate.

The gate electrode 3 is formed on the substrate 1 with the gate insulation film 2 therebetween. The source diffusion layer 4 and the drain diffusion layer 5 are formed within the substrate 1 in a state where the gate electrode 3 is positioned between, and at its sides, overlies the layers 4, 5. The interlayer insulation film 6 is formed on the substrate 1 so as to cover the FET. The source contact 11, the drain contact 12 and the gate contact 13 (shown in FIG. 2A only) are formed on the source diffusion layer 4, the drain diffusion layer 5 and the gate electrode 3 respectively within the interlayer insulation film 6.

(1) Detail of Source Contact 11 and Drain Contact 12

Next, the details of the source contact 11 and the drain contact 12 are explained by reference to FIG. 1 successively.

In FIG. 1A to FIG. 1F, for the structure of both the source contact 11 and the drain contact 12, a first contact region $C_1$ having a first size and a second contact region $C_2$ having a second size larger than the first size are shown in FIG. 2A.

In the design architecture shown in FIG. 1A, one first contact region $C_1$ is arranged on both the source diffusion layer 4 and the drain diffusion layer 5. In the same manner, in the semiconductor device shown in FIG. 1D, which corresponds to the semiconductor device shown in FIG. 1A, one first contact $C_1$ is arranged on each of the source diffusion layer 4 and the drain diffusion layer 5.

In the design architecture or layout of a semiconductor device shown in FIG. 1B, two first contact regions $C_1$ are arranged on (and contact, not shown) both the source diffusion layer 4 and the drain diffusion layer 5. On the other hand, in the actually manufactured semiconductor device using the layout of FIG. 1B as shown in FIG. 1E, which corresponds to the semiconductor device design or layout shown in FIG. 1B, one second contact region $C_2$ larger than the contact C1 of FIG. 1B is formed on (and contacts, not shown) each of the source diffusion layer 4 and the drain diffusion layer 5.

In the design architecture or layout of a semiconductor device shown in FIG. 1C, three first contact regions $C_1$ are arranged on both the source diffusion layer 4 and the drain diffusion layer 5. On the other hand, in the semiconductor device actually manufactured using the layout of FIG. 1C as shown in FIG. 1F, only one first contact region $C_1$ and one second contact region $C_2$, larger than the individual contact regions C1 of FIG. 1C, are arranged on both the source diffusion layer 4 and the drain diffusion layer 5.

The semiconductor device according to this embodiment is the semiconductor device of the generation where double exposure is performed and hence, it is difficult to form a plurality of first contact regions $C_1$ on the same source diffusion layer 4 or on the same drain diffusion layer 5 by performing the exposure one time in the same manner as the design architecture shown in FIG. 1B and FIG. 1C. The reason is that a distance between the first contacts $C_1$ is extremely small.

To overcome this drawback, in this embodiment, a photo mask is prepared, based on design architecture shown in FIG. 1B or FIG. 1C, for single exposure by replacing two first contact regions $C_1$ arranged on the same source diffusion layer 4 or on the same drain diffusion layer 5 with one second contact region $C_2$. In this embodiment, with the use of such a photo mask, the source contact 11 and the drain contact 12 can be predictably formed by performing the exposure one time.

As a result, in this embodiment, the semiconductor structures shown in FIG. 1E and FIG. 1F are manufactured based on the design data shown in FIG. 1B and FIG. 1C, respectively. For example, in the semiconductor device shown in FIG. 1F, the source contact 11 includes both the first contact region $C_1$ and the second contact region $C_2$ on the same source diffusion layer 4 and, in the same manner, the drain contact 12 includes both the first contact region $C_1$ and the second contact region $C_2$ on the same drain diffusion layer 5.

Symbol $X_1$ indicates a length of the first contact region $C_1$ to be actually manufactured in the X direction (longitudinal direction of the gate), and symbol $Y_1$ indicates a width of the first contact region $C_1$ to be actually manufactured in the Y direction (channel width direction). Further, Symbol $X_2$ indicates a length of the second contact region $C_2$ that is actually formed on the substrate in the X direction, and symbol $Y_2$ indicates a width of the second contact region $C_2$ that is actually formed on the substrate in the Y direction.

In this embodiment, the length $X_2$ is set substantially equal to the length $X_1$, while the width $Y_2$ is set wider than the size $Y_1$. Due to such a constitution, in this embodiment, the size (volume) of the second contact region $C_2$ is greater than the size (volume) of the first contact region $C_1$.

(2) Resistances $R_1$, $R_2$ of First and Second Contact Regions $C_1$, $C_2$

Next, the detail of a resistance $R_1$ of the first contact region $C_1$ and a resistance $R_2$ of the second contact region $C_2$ is explained also by reference to FIG. 1.

As described previously, in this embodiment, in manufacturing the semiconductor device based upon the design data, two first contact regions $C_1$ arranged on the same source diffusion layer 4, or on the same drain diffusion layer 5, are replaced with one second contact region $C_2$. In this case, there arises a drawback that the resistance of the source contact 11 or the resistance of the drain contact 12 is changed before and after the replacement. This change adversely influences an operating characteristic of the FET (details of this drawback are explained later in conjunction with FIG. 4).

In view of the above, in this embodiment, to allow one second contact region $C_2$ to acquire a function substantially equal to a function performed by two first contact regions $C_1$, the resistance of one second contact region $C_2$ is set to a value substantially equal to the resistance generated when two first contact regions $C_1$ are connected to each other in parallel. Due to such setting, the relationship expressed by the following formula (1) is established between the resistance $R_1$ and the resistance $R_2$.

$$1/R_2 = 1/R_1 + 1/R_1 \qquad (1)$$

To solve this formula (1), the resistance $R_2$ becomes ½ of the resistance $R_1$ ($R_2=R_1/2$).

Further, in this embodiment, the first contact region $C_1$ and the second contact region $C_2$ are formed using the same material. Accordingly, as expressed by the following formula (2), a ratio between the resistance $R_1$ and the resistance $R_2$ substantially corresponds to a ratio between the inverse number of an area $X_1Y_1$ and the inverse number of an area $X_2Y_2$.

$$R_1:R_2=1/X_1Y_1:1/X_2Y_2 \quad (2)$$

When substituting the formula (2) for the formula (1), the area $X_2Y_2$ then becomes two times greater than the area $X_1Y_1$ ($X_2Y_2=X_1Y_1\times2$).

Accordingly, in this embodiment, by setting a size $Y_2$ to a value two times greater than a size $Y_1$, the area $X_2Y_2$ is set to a value approximately two times greater than the area $X_1Y_1$. In this embodiment, by setting the resistance $R_2$ to a value approximately ½ of the resistance $R_1$ in this manner, it is possible to allow one second contact region $C_2$ to acquire a function substantially equal to a function acquired by two first contact regions $C_1$.

However, in this embodiment, in general, the ratio between the resistances does not strictly correspond with the ratio between the inverse numbers of the areas which is expressed by the formula (2). One of reasons is that, as shown in FIG. 2B, a side surface of the source contact 11 and a side surface of the drain contact 12 are generally angled or inclined relative to a plane of the substrate 1. Further, in a case where planar shapes of the source contact 11 and the drain contact 12 to be manufactured actually are closer to a circular shape or an elliptical shape rather than a square shape or a rectangular shape, such shapes also cause the above-mentioned disagreement between the ratios.

Accordingly, in this embodiment, in setting the resistance $R_2$ to ½ of the resistance $R_1$, an area $X_2Y_2$ may not be simply set to an area two times greater than the area $X_1Y_1$, but the area $X_2Y_2$ is adjusted to an area in the range of or about the area which is twice as large as the area $X_1Y_1$ by finely adjusting the area such that the resistance $R_2$ approaches ½ of the resistance $R_1$. Such fine adjustment can be performed such that, for example, in preparing a photo mask, an area of the second contact region $C_2$ on the photo mask is finely adjusted, or Optical Proximity Correction (OPC) is applied to a pattern for a second contact region $C_2$ on the photo mask.

Further, in this embodiment, in manufacturing the semiconductor device based on design data, N (N being an integer of 2 or more) areas of the first contact region $C_1$ arranged on the same source diffusion layer 4, or on the same drain diffusion layer 5, may be replaced with one second contact region $C_2$. That is, as shown in FIG. 1, this embodiment is applicable not only to a case where two first contact regions $C_1$ are replaced with one second contact region $C_2$ but also to a case where three or more first contact regions $C_1$ are replaced with one second contact region $C_2$.

In this case, to allow one second contact region $C_2$ to have a function substantially equal to a function of N first contact regions $C_1$, the resistance of one second contact region $C_2$ is set to a value substantially equal to the resistance of N first contact regions $C_1$ which are connected to each other in parallel. That is, the resistance $R_2$ is set to 1/N of the resistance $R_1$. Such setting can be realized by setting the area $X_2Y_2$ to an area N times as the size of the area $X_1Y_1$ based on the relationship expressed by the formula (2).

In this case, by taking into account the instance where the formula (2) is not strictly established as described above, the resistance $R_2$ may have a tolerance of approximately ±10%. To be more specific, as expressed by the following formula (3), a value of the resistance $R_2$ is not always limited to $R_1/N$ which is a parallel resistance of N first contact regions $C_2$, but may be set to a value of 0.9 times to 1.1 times as large as $R_1/N$.

$$0.9\times R_1/N \leq R_2 \leq 1.1\times R_1/N \quad (3)$$

For example, in the instance where N is 2 (N=2) (in the case where two first contact regions $C_1$ are replaced with one second contact region $C_2$ as shown in FIG. 1), a value of the resistance $R_2$ is not always limited to $R_1/2$ (=0.5×$R_1$), but is set to a value which falls within a range of 0.45×$R_1$ to 0.55×$R_1$.

Further, in this embodiment, the first and second contact regions $C_1$, $C_2$ may be formed using only one kind of material, or may be formed using two or more kinds of materials. In the latter case, however, since a ratio between the resistance $R_1$ and the resistance $R_2$ depends on electrical resistivities of these materials, in general, it is necessary to take into account the electrical resistivities of the materials in adjusting the ratio between the resistances $R_1$, $R_2$.

(3) Comparison Between the First Embodiment and a Conventional Example

Figure 3A:
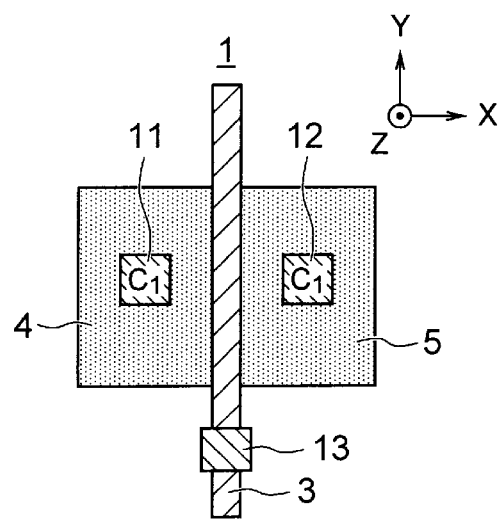
FIG. 3A to FIG. 3F are plan views showing the structure of a conventional semiconductor device.
Figure 3B:
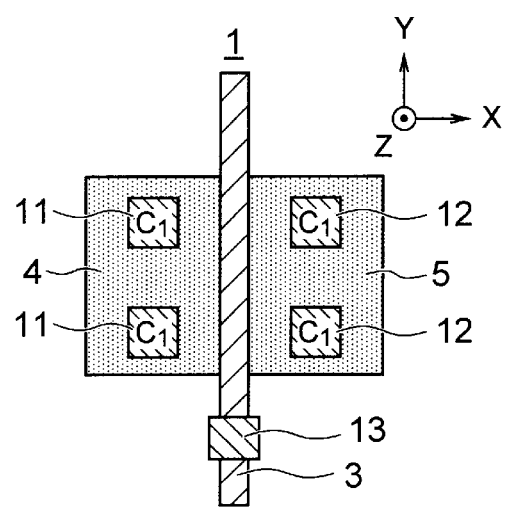
Figure 3C:
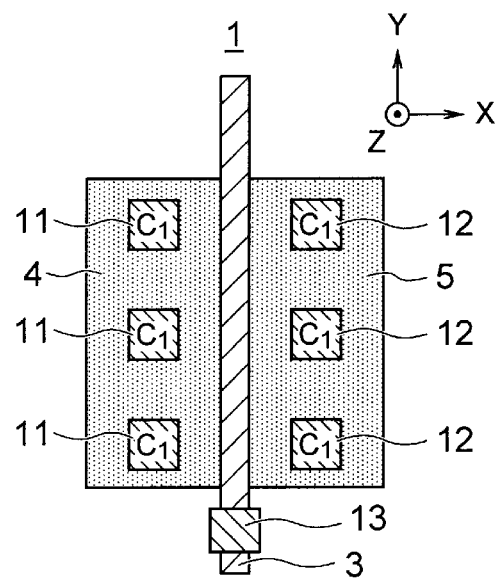
Figure 3D:
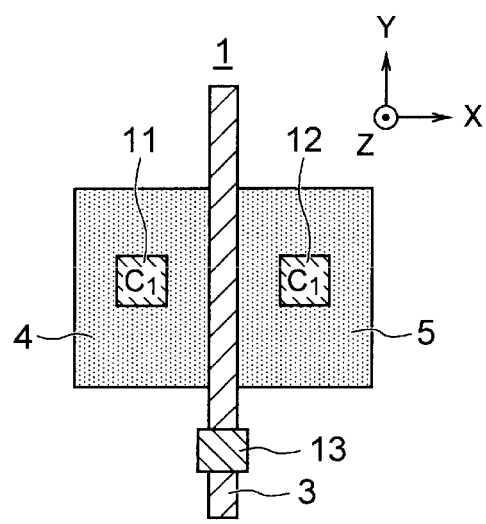
Figure 3E:
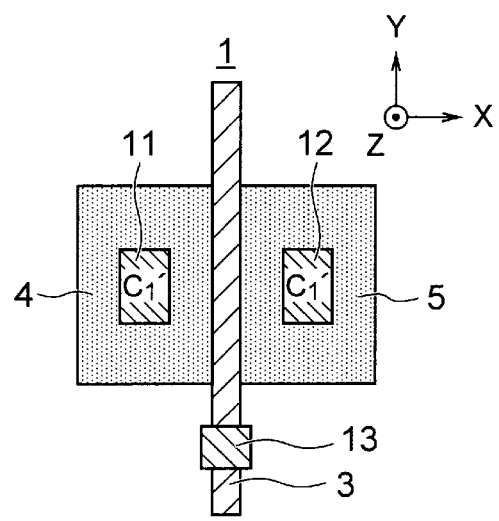
Figure 3F:
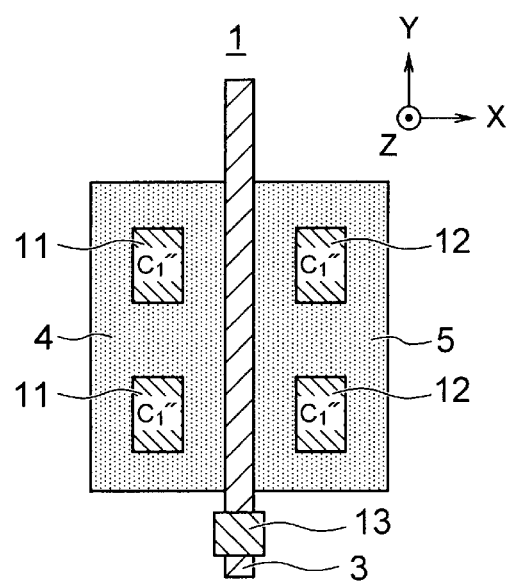
Figure 4:
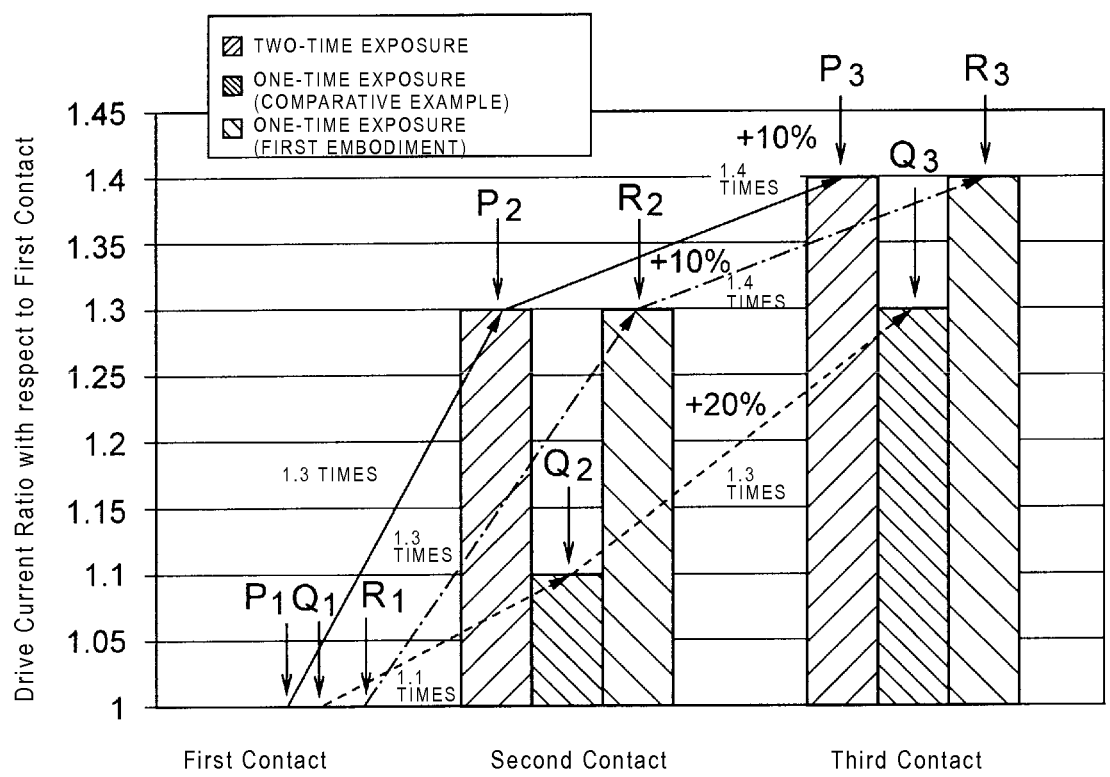
FIG. 4 is a graph for comparing the operations between the semiconductor device of the first embodiment and the conventional semiconductor device of FIG. 3A to FIG. 3F.

Next, by reference to FIG. 3 and FIG. 4, the semiconductor device of the first embodiment and the semiconductor device of a conventional example are compared.

FIG. 3A to FIG. 3F are plan views showing the layout or pattern of structure based upon design data of the semiconductor device of the conventional example and the structure of the semiconductor device of the conventional example to be actually manufactured. FIG. 3A to FIG. 3C show the design data which are equal to the design data shown in FIG. 1A to FIG. 1C respectively. Further, FIG. 3D to FIG. 3F show the structures of the resulting semiconductor device to be actually manufactured based on the design data shown in FIG. 3A to FIG. 3C, respectively.

In the conventional example, in the same manner as the first embodiment, it is difficult to manufacture a plurality of first contact regions $C_1$ arranged on the same source diffusion layer 4, or on the same drain diffusion layer 5, by performing exposure one time as in the design data shown in FIG. 3B and FIG. 3C.

Accordingly, in the conventional example, in preparing a photo mask based on design data shown in FIG. 3B, a photo mask for one-time exposure is prepared by replacing two first contact regions $C_1$ with one contact region $C_1{'}$ (shown in FIG. 3E) which is larger than the first contact region $C_1$ Further, in the conventional example, in preparing a photo mask based on the design data shown in FIG. 3C, a photo mask for one-time exposure is prepared by replacing three first contact regions $C_1$ with two contact regions $C_1{''}$ (shown in FIG. 3F) which are larger than each of the first contact regions $C_1$.

As a result, in this comparative example, the semiconductor device shown in FIG. 3E and FIG. 3F are manufactured based on the design data shown in FIG. 3B and FIG. 3C, respectively.

In this manner, in this example, in the same manner as the first embodiment, the replacement of the contact is performed when the semiconductor device is manufactured based upon design data. In this example, however, different from the first embodiment, in performing such contact area replacement, an operation to make a contact resistance before the replacement correspond with a contact resistance after the replacement is not taken into consideration. Accordingly, in this conventional example, as shown in FIG. 4, an operating characteristic of a FET is different before and after the replacement.

FIG. 4 is a graph for comparing the manner of operation of the semiconductor device of the first embodiment with the manner of operation of the semiconductor device of the comparative example described in FIGS. 3A-3F.

Bars $P_1$, $P_2$, $P_3$ show the drive currents of FETs in instances where the semiconductor devices are manufactured by double (two-time) exposure based on the design data shown in FIG. 1A to FIG. 1C, respectively. Here, values of all drive currents expressed by the bars $P_1$, $P_2$, $P_3$ are values obtained by dividing values of the drive currents of the FETs by values of the drive currents of the FETs in the semiconductor devices manufactured by double exposure based on the design data shown in FIG. 1A.

Bars $Q_1$, $Q_2$, $Q_3$ show drive currents of the FETs in cases where the semiconductor devices of the comparative examples shown in FIG. 3D to FIG. 3F are manufactured by single exposure based on the design data shown in FIG. 3A to FIG. 3C, respectively. Here, values of all drive currents expressed by the bars $Q_1$, $Q_2$, $Q_3$ are values obtained by dividing values of the drive currents of the FETs by a value of the drive current of the FET in the semiconductor device of the comparative example shown in FIG. 3D to be manufactured by single exposure.

Bars $R_1$, $R_2$, $R_3$ show drive currents of the FETs in cases where the semiconductor devices of the first embodiment shown in FIG. 1D to FIG. 1F are manufactured by single exposure based on the design data shown in FIG. 1A to FIG. 1C, respectively. Here, values of all drive currents expressed by the bars $R_1$, $R_2$, $R_3$ are values obtained by dividing values of the drive currents of the FETs by a value of the drive current of the FET in the semiconductor device of the first embodiment shown in FIG. 1D to be manufactured by single exposure based on the design data shown in FIG. 1A.

In the case of the double exposure indicated by the bars $P_1$ to $P_3$, when the number of first contact regions $C_1$ (hereinafter referred to as "contact region number") per one source diffusion layer 4, or per one drain diffusion layer 5, is increased from 1 to 2, the drive current is increased 1.3 times. Further, in the case of the bars $P_1$ to $P_3$, when the contact region number is increased from 1 to 3, the drive current is increased 1.4 times.

On the other hand, in the case of single exposure in the comparative example indicated by bars $Q_1$ to $Q_3$, when the contact region number is increased from 1 to 2, the drive current is increased 1.1 times. Further, in the cases of the bars $Q_1$ to $Q_3$, when the contact region number is increased from 1 to 3, the drive current is increased 1.3 times.

In this manner, when the double exposure is replaced with single exposure of the conventional example, in the FET manufactured by single exposure, an irregular layout dependency, which is different from the layout dependency of the FET manufactured by double exposure, is generated. In this case, the design and an operation verification methodology of the FET manufactured by the double exposure method cannot be utilized in FETs manufactured by the single exposure method. Thus, it becomes necessary to perform the operation verification independently.

Further, in the case of the 28 nm generation, when such a problem exists, the design and an operation verification result of the FET of 32 nm generation manufactured by the single exposure cannot be utilized in FETs of the 28 nm generation which are manufactured by single exposure. Thus, it is necessary to perform the operation verification independently with respect to the 28 nm generation. Here, when the bars $P_1$, $P_2$, $P_3$ indicate operating characteristics of FETs of 28 nm, which are manufactured by double exposure under the same design environment as the 32 nm generation, the bars $P_1$, $P_2$, $P_3$ correspond with the operating characteristics of FETs of the 32 nm generation which are manufactured using single exposure.

Accordingly, in the first embodiment, as described previously, to allow one second contact region $C_2$ to have a function substantially equal to a function of two first contact regions $C_1$, the resistance of one second contact region $C_2$ is set to a value substantially equal to the resistance of two first contact regions $C_1$ which are connected to each other in parallel.

As a result, in the case of the single exposure in the first embodiment indicated by the bars $R_1$ to $R_3$, the layout dependency is substantially equal to the layout dependency when double exposure is performed, as indicated by the bars $P_1$ to $P_3$. According to the first embodiment, the design and an operation verification result of the FET manufactured by double exposure can be utilized with FETs manufactured by single exposure. Further, the design and the operation verification result of the FET of a 32 nm generation can be utilized by FETs of the 28 nm generation, which is the half-node generation of the 32 nm generation.

(4) Modification of First Embodiment

Next, a modification of the first embodiment is explained in conjunction with FIG. 5.

FIG. 5 is a plan view showing the structure of a semiconductor device according to the modification of the first embodiment.

Figure 5A:
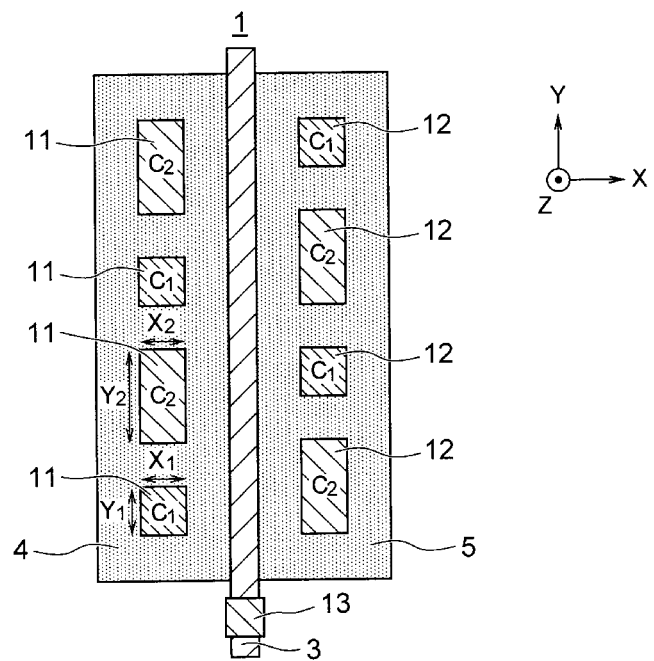
FIGS. 5A and 5B are plan views showing the structure of a semiconductor device according to a second embodiment.

In FIG. 5A, two first contact regions $C_1$ and two second contact regions $C_2$ are arranged on each of a source diffusion layer 4 and a drain diffusion layer 5. In this manner, in this modification, a plurality of first contact regions $C_1$ and a plurality of second contact regions $C_2$ may be arranged on each of the same source diffusion layer 4 and the same drain diffusion layer 5.

Here, on the source diffusion layer 4 shown in FIG. 5A, the first contact regions $C_1$ and the second contact regions $C_2$ are arranged alternately. In the same manner, on the drain diffusion layer 5 shown in FIG. 5A, the first contact regions $C_1$ and the second contact regions $C_2$ are arranged alternately. Such an arrangement has an advantageous effect that, compared with an arrangement where same kind of contacts are consecutively arranged adjacent to each other, makes it easy to balance an electric current or balance resistance in the source diffusion layer 4 and in the drain diffusion layer 5, for example.

In FIG. 5A, both the first contact regions $C_1$ on the source diffusion layer 4 are arranged adjacent to second contact regions $C_2$ on the drain diffusion layer 5, respectively, with a gate electrode 3 sandwiched therebetween. In the same manner, both the second contact regions $C_2$ on the source diffusion layer 4 are arranged adjacent to first contact regions $C_1$ on the drain diffusion layer 5, respectively, with the gate electrode 3 sandwiched therebetween. Such an arrangement has an advantageous effect that, compared with an arrangement where the same kind of contacts are arranged adjacent to each other with the gate electrode 3 sandwiched therebetween, it is easy to balance an electric current and balance resistances in the source diffusion layer 4 or in the drain diffusion layer 5, for example.

Figure 5B:
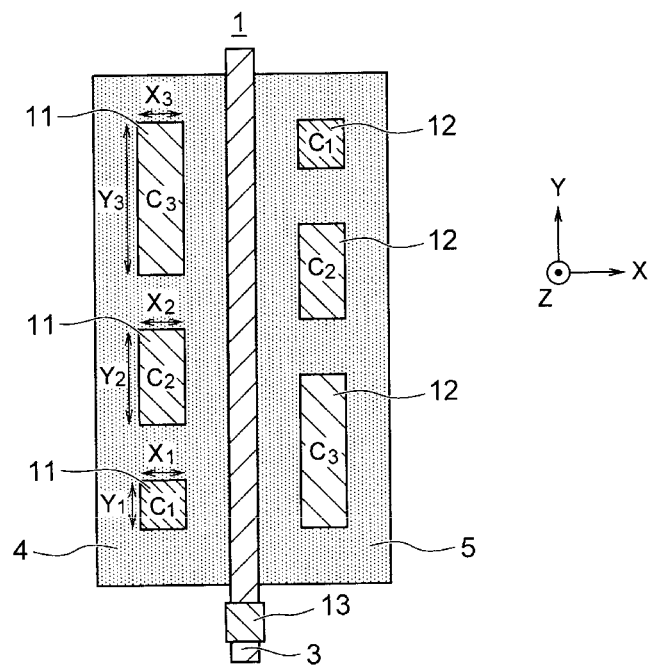

In FIG. 5B, a first contact region $C_1$ having a first size, a second contact region $C_2$ having a second size greater than the first size, and a third contact region $C_3$ having a third size greater than the second size are arranged on each of the source diffusion layer 4 and the drain diffusion layer 5. In this manner, according to this modification, three or more kinds of contact regions may be arranged on each of the same source diffusion layer 4 and the same drain diffusion layer 5. Here, the third contact region $C_3$ corresponds to an example of a second contact region in the case where the above-mentioned value of N is 3 or more.

In this embodiment, only two kinds of contacts may be used as source contacts 11 and drain contacts 12. Alternatively, three or more kinds of contact regions may be used as shown in FIG. 5B. However, by setting a low number of kinds of contact regions to be used, it is possible to acquire an advantageous effect that the manufacture of the semiconductor device becomes easier, which includes simplification of the preparation of the photo mask. When the number of kinds of contact regions to be used is small, for example, as shown in FIG. 1(F), the number of occasions where plural kinds of contact regions are arranged on the same source diffusion layer 4, or the same drain diffusion layer 5, is increased.

In this embodiment, in the replacement of the first contact regions $C_1$ with the second contact region $C_2$, the length $X_2$ and the length $X_1$ are set substantially equal to each other in length, and the width $Y_2$ is set longer than the width $Y_1$. As an alternative example, it may be possible to set these widths and lengths such that the length $X_2$ is set to be greater than the length $X_1$, and the width $Y_2$ and the width $Y_1$ are set to be substantially equal to each other. In this embodiment, it may be also possible to set these dimensions such that the length $X_2$ and the length $X_1$ differ from each other in length, and the size $Y_2$ and the size $Y_1$ differ from each other. For example, the area $X_2Y_2$ may be set to a value two times greater than the area $X_1Y_1$ by setting the length $X_2$ to a value $\sqrt{2}$ times as large as the length $X_1$ and by setting the width $Y_2$ to a value $\sqrt{2}$ times as large as the width $Y_1$. In these cases, however, it is desirable that the dimensions and the arrangement of the contact regions are determined such that the distance between the contact regions is set so as to allow single exposure methods, i.e., they are spaced so that irregular formation thereof does not occur.

Further, in this embodiment, although the number of the source contacts 11 which are arranged on the source diffusion layer 4 and the number of the drain contacts 12 which are arranged on the drain diffusion layer 5 are set equal, the number of the source contact 11 and the number of the drain contact 12 may be different from each other.

As described above, in this embodiment, in manufacturing the semiconductor device based on the design data, the first contact regions $C_1$ arranged on the source diffusion layer 4, or on the drain diffusion layer 5, are replaced with the above-mentioned second contact region $C_2$, thus manufacturing the semiconductor devices exemplified in FIG. 1E and FIG. 1F. According to this embodiment, in manufacturing the contact regions by replacing plural exposure methods to a single exposure method, it is possible to suppress irregular layout dependency.

Second Embodiment

Figure 6:
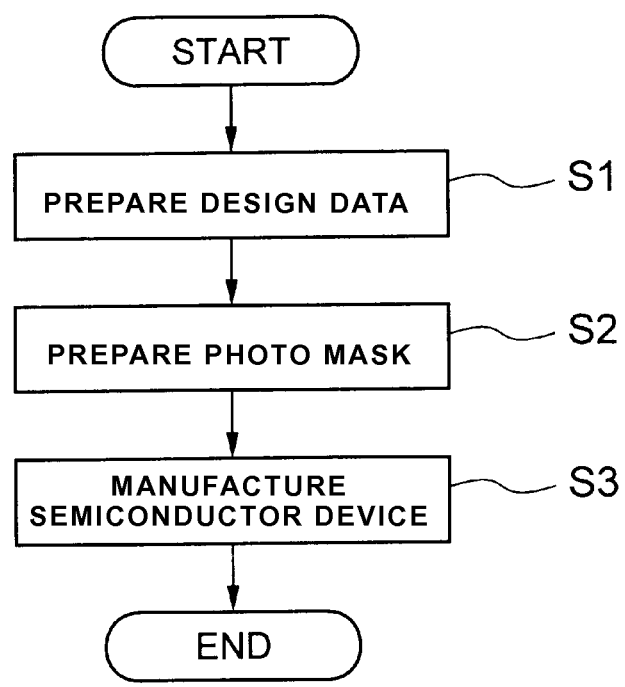
FIG. 6 is a flowchart showing a manufacturing method of a semiconductor device of according to one embodiment.

FIG. 6 is a flowchart showing a manufacturing method of a semiconductor device according to one embodiment. FIG. 6 shows one example of steps for manufacturing the semiconductor devices shown in FIG. 1D to FIG. 1F based upon the design data shown in FIG. 1A to FIG. 1C.

Firstly, design data for manufacturing the semiconductor device having the structure shown in FIG. 1A to FIG. 1C is prepared (step S1).

Next, a photo mask is prepared based on the design data (step S2). Here, in handling the design data shown in FIG. 1A, a photo mask for single exposure is prepared for manufacturing a semiconductor device which exactly complies with the design data. On the other hand, in handling the design data shown in FIG. 1B or FIG. 1C, a photo mask for single exposure is prepared by replacing two first contact regions $C_1$ arranged on the same source diffusion layer 4, or on the same drain diffusion layer 5, with one second contact region $C_2$.

Next, a semiconductor device is manufactured using the above-mentioned photo mask (step S3). Here, source contacts 11 or drain contacts 12 can be manufactured by single exposure. In this manner, the semiconductor devices shown in FIG. 1D to FIG. 1F are manufactured based on the design data shown in FIG. 1A to FIG. 1C respectively.

As described above, according to this embodiment, not only in the handling of the design data shown in FIG. 1A, but also in the handling of design data shown in FIG. 1B or FIG. 1C, it is possible to manufacture the source contact 11 and the drain contact 12 by single exposure. In this embodiment, by performing the replacement of the first contact region $C_1$ with the second contact region $C_2$ in the same manner as the first embodiment, it is possible to suppress the generation of the above-mentioned irregular layout dependency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:

preparing design data for manufacturing a semiconductor device which comprises a first contact region having a first size;

preparing a photo mask based on the design data, wherein N (N being an integer of 2 or more) first contact regions are replaced with one second contact region having a second size greater than the first size; and forming a semiconductor device having the first contact region and the second contact region formed on at least one of a common source diffusion layer and a common drain diffusion layer using the photo mask.

2. The manufacturing method of claim 1, wherein the first contact region formed on the common source diffusion layer is arranged adjacent to the second contact region formed on the common drain diffusion layer.

3. The manufacturing method of claim 2, wherein the second contact region formed on the common source diffusion layer is arranged adjacent to the first contact region formed on the common drain diffusion layer.

4. The manufacturing method of claim 1, further comprising:

preparing the photo mask to include a third contact region having a third size greater than the second size, and forming the third contact region on at least one of the common source diffusion layer and the common drain diffusion layer using the photo mask.

5. The manufacturing method of claim 1, wherein
the first contact region and the second contact region are alternately arranged on at least one of the common source diffusion layer and the common drain diffusion layer.

6. The manufacturing method of claim 1, wherein
a resistance of the second contact region is 0.9 times to 1.1 times a resistance of N (N being an integer of 2 or more) first contact regions which are connected to each other in parallel.

7. A manufacturing method of a semiconductor device, comprising:
preparing design data for manufacturing a semiconductor device which comprises a first contact region having a first size;
preparing a photo mask based on the design data, wherein N (N being an integer of 2 or more) first contact regions are replaced with a single second contact region having a second size larger than the first size, and having a resistance from 0.9 times to 1.1 times a resistance of the N first contact regions which are connected to each other in parallel; and
forming the semiconductor device having the second contact region on at least one of a source diffusion layer and a drain diffusion layer using the photo mask.

8. The manufacturing method of claim 7, wherein
the N first contact regions and the second contact region are alternately arranged on at least one of the source diffusion layer and the drain diffusion layer.

9. The manufacturing method of claim 7, wherein
the first contact region formed on the source diffusion layer is arranged adjacent to the second contact region formed on the drain diffusion layer.

10. The manufacturing method of claim 9, wherein
the second contact region formed on the source diffusion layer is arranged adjacent to the first contact region formed on the drain diffusion layer.

11. The manufacturing method of claim 7, wherein
the N first contact regions and the second contact region are arranged on at least one of the source diffusion layer and the drain diffusion layer, respectively.

12. The manufacturing method of claim 7, further comprising:
preparing the photo mask to include a third contact region having a third size greater than the second size, and
forming the third contact region on at least one of the source diffusion layer and the drain diffusion layer using the photo mask.

\* \* \* \* \*